US011646215B2

(12) United States Patent
Abe et al.

(10) Patent No.: US 11,646,215 B2
(45) Date of Patent: May 9, 2023

(54) LOAD PORT APPARATUS AND METHOD OF DRIVING THE SAME

(71) Applicant: TDK CORPORATION, Tokyo (JP)

(72) Inventors: Tomoshi Abe, Tokyo (JP); Hiroshi Hasegawa, Tokyo (JP); Nozomu Kato, Tokyo (JP); Hiroshi Igarashi, Tokyo (JP); Tadamasa Iwamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 186 days.

(21) Appl. No.: 17/064,637

(22) Filed: Oct. 7, 2020

(65) Prior Publication Data

US 2021/0104424 A1    Apr. 8, 2021

(30) Foreign Application Priority Data

Oct. 7, 2019    (JP) .............................. JP2019-184751

(51) Int. Cl.
*H01L 21/677* (2006.01)
*H01L 21/673* (2006.01)

(52) U.S. Cl.
CPC .. *H01L 21/67775* (2013.01); *H01L 21/67383* (2013.01); *H01L 21/67772* (2013.01)

(58) Field of Classification Search
CPC ......... H01L 21/67772; H01L 21/67383; H01L 21/67775
See application file for complete search history.

(56) References Cited

U.S. PATENT DOCUMENTS

| 2003/0154002 A1* | 8/2003 | Lappen ............. H01L 21/67775 700/218 |
| 2010/0133270 A1* | 6/2010 | Okabe ............... H01L 21/67772 220/212 |
| 2011/0188977 A1* | 8/2011 | Toyoda .................. H01L 21/67 414/810 |
| 2014/0199140 A1* | 7/2014 | Matsumoto ....... H01L 21/67772 414/222.07 |
| 2017/0178941 A1 | 6/2017 | Matsumoto et al. |
| 2019/0096728 A1 | 3/2019 | Iwamoto et al. |

FOREIGN PATENT DOCUMENTS

| JP | 2010-129855 A | 6/2010 |
| JP | 2011-165719 A | 8/2011 |
| JP | 2014-138011 A | 7/2014 |
| JP | 2019-062104 A | 4/2019 |

* cited by examiner

*Primary Examiner* — Gerald McClain
(74) *Attorney, Agent, or Firm* — Oliff PLC

(57) ABSTRACT

A load port apparatus connects a main opening of a wafer transportation container to a frame opening. The apparatus includes an installation unit, a frame unit, a flange clamp unit, and a detection unit. The installation unit includes an installation table configured to install the container and relatively move to the frame opening. The frame unit is upright upward from the installation unit and includes the frame opening. The flange clamp unit includes an engagement section and a drive section. The engagement section is engageable with a flange surrounding an outer circumference of the main opening. The drive section drives the engagement section to carry out an engagement operation and a separation operation. The detection unit detects the engagement operation by the flange clamp unit with classification into a normal engagement operation and an abnormal engagement operation.

11 Claims, 9 Drawing Sheets

LOAD PORT APPARATUS AND METHOD OF DRIVING THE SAME

BACKGROUND OF THE INVENTION

The present invention relates to a load port apparatus and a method of driving the load port apparatus.

In the semiconductor manufacturing process, wafers are transported among processing devices using a wafer transportation container, such as FOUP and FOSB. The wafer transfer container includes a main opening for taking in or out the wafers and a lid for closing the main opening, and the wafers inside the wafer transportation container are stored in a space sealed by the lid.

When the lid of the wafer transportation container is opened to take out the wafers from the inside of the wafer transportation container, when the cleaning gas is introduced from the main opening, and the like, a load port apparatus for connecting the wafer transportation container to an opening is used. When the load port apparatus is used, the internal space of the wafer transportation container can airtightly be connected to another space, such as mini-environment, via the opening, and the wafers inside the wafer transportation container can be taken in or out therefrom while being isolated from other spaces in a semiconductor factory.

Moreover, proposed is a load port apparatus including a clamp unit that prevents a positional shifting of the wafer transportation container and appropriately connects the wafer transportation container to a frame opening. Such a load port apparatus engages its engagement section with a flange of the wafer transportation container and can thereby maintain an appropriate connection state between the wafer transportation container and the frame opening.

Patent Document 1: JP2019062104 (A)

BRIEF SUMMARY OF INVENTION

In the conventional load port apparatus, an engagement section may not normally be able to engage with a flange of a wafer transportation container due to deformation of the wafer transportation container or slight displacement of the installation position even if the flange clamp unit is operated. When the flange clamp unit cannot be engaged with the flange of the wafer transportation container, there is a leakage problem of the inner gases of the wafer transportation container and a transportation chamber of a minienvironment to the outside, for example, in connecting the container to the chamber by opening the lid of the container.

The present invention has been achieved under such circumstances. It is an object of the invention to provide a load port apparatus capable of preventing a leakage problem of inner gas from a connection part to the outside at the time of opening a lid of a wafer transportation container.

To achieve the above object, a load port apparatus according to the present invention for connecting a main opening of a wafer transportation container to a frame opening includes:

an installation unit including an installation table configured to install the wafer transportation container and relatively move to the frame opening;

a frame unit being upright upward from the installation unit and including the frame opening;

a flange clamp unit including:
an engagement section engageable with a flange surrounding an outer circumference of the main opening; and a drive section for driving the engagement section to carry out an engagement operation for engaging the engagement section with the flange and a separation operation for separating the engagement section from the flange; and a detection unit configured to detect the engagement operation by the flange clamp unit with classification into a normal engagement operation and an abnormal engagement operation.

Since the load port apparatus according to the present invention includes a detection unit configured to detect the engagement operation by the flange clamp unit with classification into a normal engagement operation and an abnormal engagement operation, the detection unit can detect a state where the engagement section cannot normally be engaged with the flange of the wafer transportation container even if the flange clamp unit is operated. Thus, the load port apparatus prevents the control from continuing without recognizing an abnormal engagement operation actually done by the flange clamp unit and makes it possible to prevent a leakage problem of inner gas from the connection part to the outside at the time of, for example, opening the lid of the wafer transportation container.

For example, the engagement section may engage from above or side with an engaged part formed on the flange and opening in an outer radial direction of the flange.

Such a flange clamp unit is advantageous from the viewpoint of miniaturization compared to a mechanism where a wafer transportation container is pushed overall from its behind against a frame unit.

For example, the drive section may include a first operation portion connected to the engagement section and configured to reciprocate in a first direction, and the engagement section may include a second operation portion configured to operate in a second direction different from the first direction and to engage with or separate from the flange.

When the first operation portion of the drive section and the second operation portion of the engagement section operate in different directions, the engagement section of the flange clamp unit can engage with the flange with a small movement amount while preventing the flange clamp unit from interfering with a movement path of the wafer transportation container.

For example, the first direction, where the first operation portion reciprocates, may be substantially perpendicular to a third direction, where the engagement section pushes the flange against the frame unit.

Such a load port apparatus can apply a force for pushing the flange against the frame unit by a small flange clamp unit and can thereby securely prevent the leakage of inner gas from the connection part.

For example, the drive section may include a first operation portion being movable among a first position, a second position, and a third position in a first direction, the engagement section may be separate from the flange when the first operation portion is at the first position, the engagement section may be in the normal engagement operation for the flange when the first operation portion is at the second position, the engagement section may be in the abnormal engagement operation for the flange when the first operation portion is at the third position, and the detection unit may detect that the first operation portion is at the second position while distinguishing from a case where the first operation portion is at the first position or the third position.

In such a load port apparatus, the detection unit detects a position of the first operation portion of the drive section, and it is thereby found that the engagement section is in a normal engagement operation. This makes it possible to achieve a reliable detection.

For example, the detection unit may include a light emitter and a light receiver capable of receiving a light of the light emitter, and the first operation portion may include a detection operation member including: a first part configured to direct the light of the light emitter toward the light receiver; and a second part configured to block, adsorb, or direct the light of the light emitter toward a direction different from the light receiver.

In such a load port apparatus, the detection operation member is detected with optical sensor, and an engagement operation by the engagement section can thereby accurately be detected with classification into a normal engagement operation or an abnormal engagement operation.

For example, the load port apparatus according to the present invention may include at least two flange clamp units arranged with a predetermined interval, and the light of the light emitter of the detection unit may be able to enter the light receiver via at least two first parts included in the detection operation members of the flange clamp units.

In such a load port apparatus, one detection unit detects that at least two flange clamp units are in a normal engagement operation, and it is thereby possible to further securely prevent a leakage problem of inner gas to the outside with a simplified apparatus.

For example, the load port apparatus according to the present invention may further include a coverage unit attached to a surface of the frame unit on the installation unit side and at least partly covering the flange clamp unit.

The load port apparatus including such a coverage unit can protect the flange clamp unit by the coverage unit. In addition, such a disposition of the flange clamp unit contributes to miniaturization of the load port apparatus.

For example, the load port apparatus according to the present invention may further include a door configured to engage with a lid attached to the main opening of the wafer transportation container and to open or close the main opening and the frame opening; a door drive section configured to drive the door; and an interlock system configured to allow the door drive section to open the door only when the detection unit detects the normal engagement operation.

In such a load port apparatus, the interlock system prevents the lid of the wafer transportation container from opening even if the flange clamp unit carries out an abnormal engagement operation, and it is thereby possible to further securely prevent a leakage problem of inner gas to the outside.

A method of driving a load port apparatus according to the present invention includes the steps of:

transporting a wafer transportation container installed on an installation table to a connection position, where the wafer transportation container is close to a frame opening;

driving a drive section of a flange clamp unit so as to carry out an engagement operation, where an engagement section of the flange clamp unit engages with a flange of the wafer transportation container;

detecting whether or not the engagement operation of the engagement section is a normal engagement operation; and opening a lid attached to a main opening of the wafer transportation container and the frame opening, wherein the step of opening the lid and the frame opening can be carried out only when the normal engagement operation is detected.

In the method, the lid of the wafer transportation container is prevented from opening even if the flange clamp unit carries out an abnormal engagement operation, and it is thereby possible to securely prevent a leakage problem of inner gas to the outside.

DETAILED DESCRIPTION OF INVENTION

Hereinafter, the present invention is explained based on embodiments shown in the figures.

Figure 1:
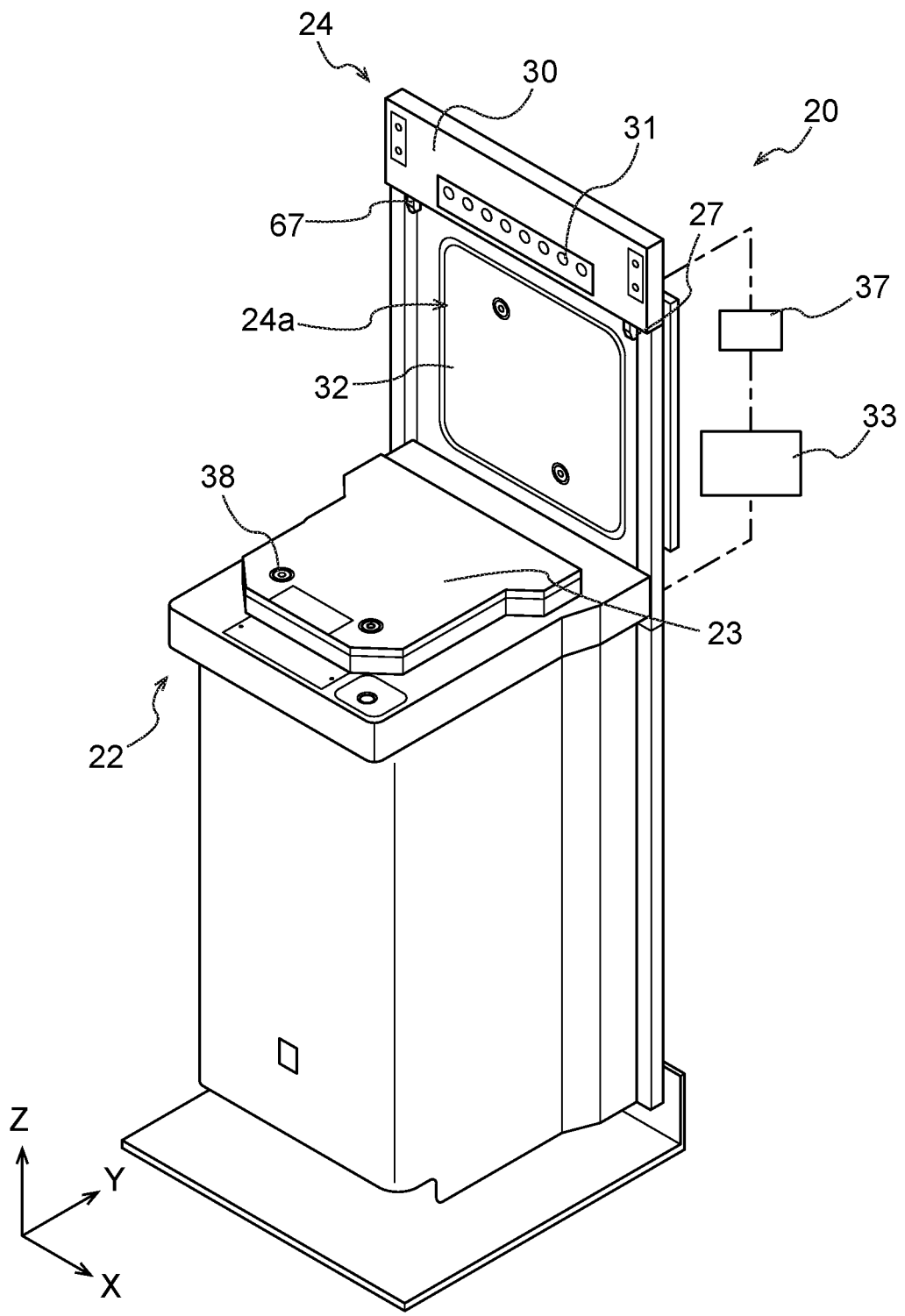
FIG. 1 is a schematic perspective view of a load port apparatus according to an embodiment of the present invention.

FIG. 1 is a schematic perspective view of a load port apparatus 20 according to First Embodiment of the present invention. For example, the load port apparatus 20 is used as an interface that connects a wafer transportation container 10 to a space where a minienvironment is formed in semiconductor factories. The load port apparatus 20 is installed so that a frame unit 24 constitutes a part of side walls forming a minienvironment and connects a main opening 12a of the wafer transportation container 10 shown in FIG. 2 to a frame opening 24a (see FIG. 2 and FIG. 7).

Figure 3:
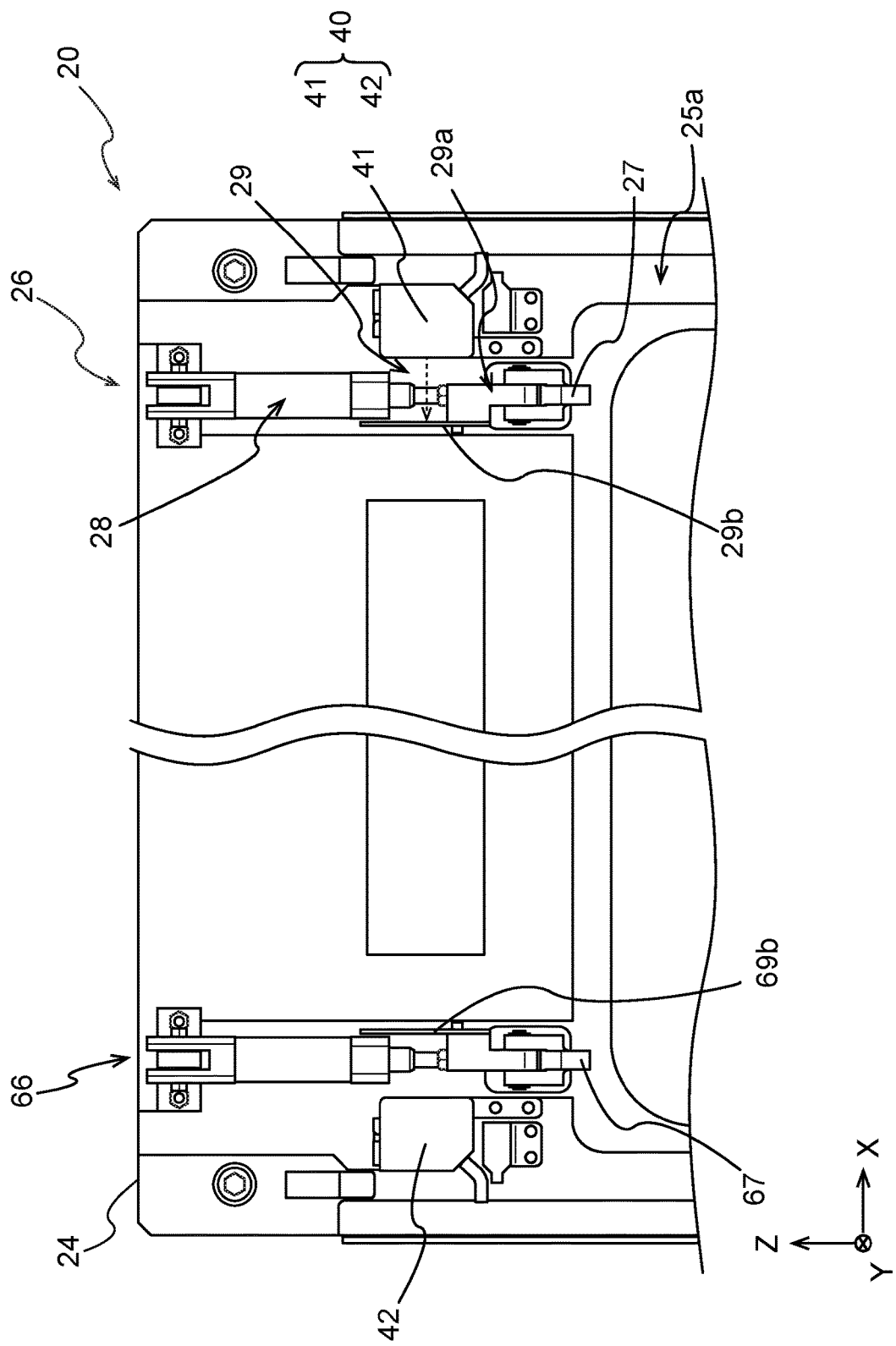
FIG. 3 is a partially enlarged view of a flange clamp unit included in the load port apparatus shown in FIG. 1.

As shown in FIG. 1, the load port apparatus 20 includes an installation unit 22 having an installation table 23, the frame unit 24 having the frame opening 24a, a coverage unit 30, a door 32 and a door drive section 33, an interlock system 37, flange clamp units 26 and 66 shown in FIG. 3, and a detection unit 40. In addition, the load port apparatus 20 includes a bottom clamp unit (not illustrated) that is engageable with the bottom of the wafer transportation container 10 to fix it with the installation unit 22, a bottom purge unit 38 that introduces a cleaning gas from the bottom of the wafer transportation container 10 into the container, and the like.

Figure 2:
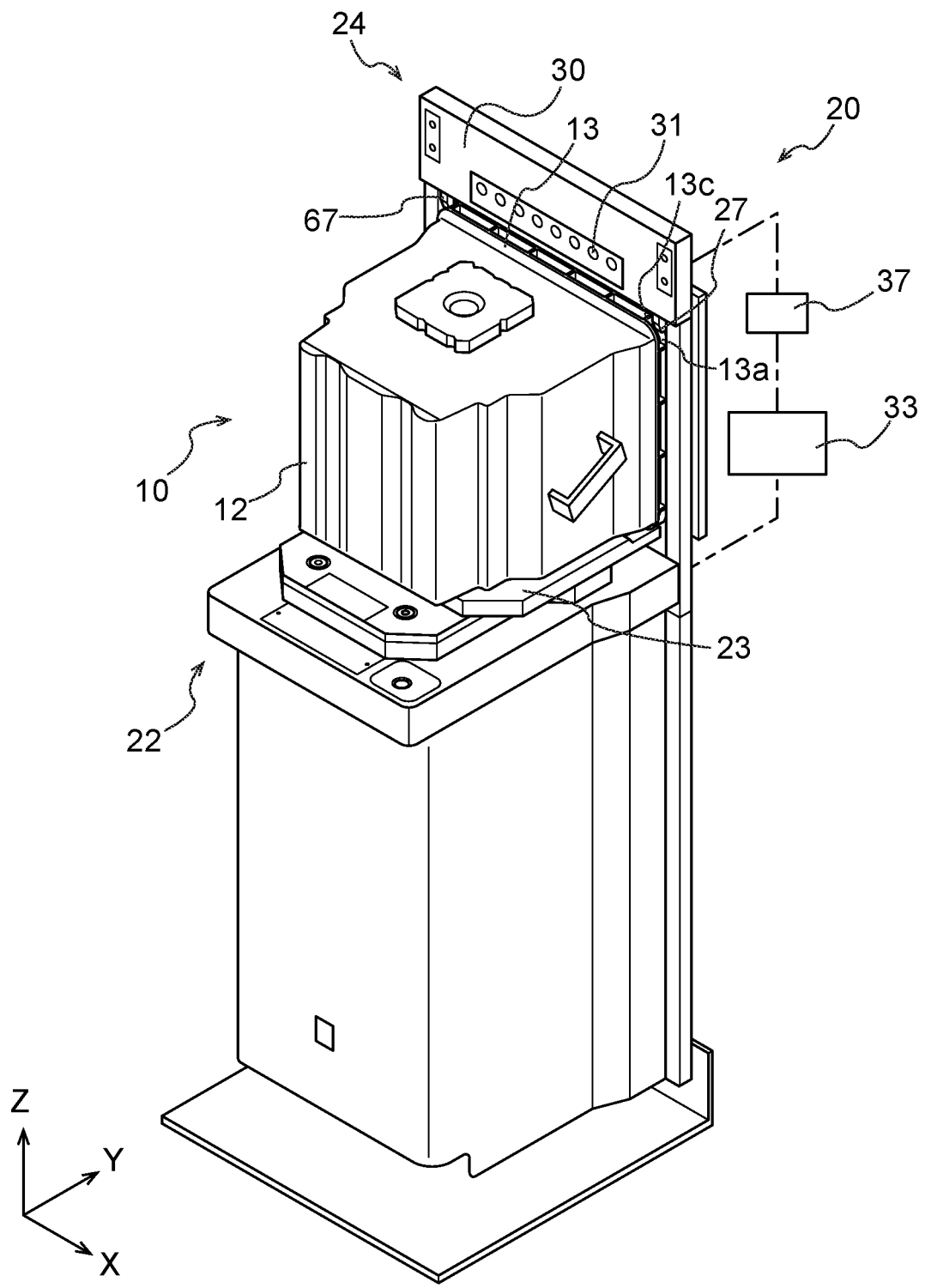
FIG. 2 is a schematic perspective view illustrating a state where a wafer transportation container is installed on the load port apparatus shown in FIG. 1.

FIG. 2 is a schematic perspective view illustrating a state where the wafer transportation container 10 is installed on the load port apparatus shown in FIG. 1. As shown in FIG. 2, the wafer transportation container 10 is installed on the installation unit 22 of the load port apparatus 20. The wafer transportation container 10 is a container for transporting wafers in semiconductor factories or so and is FOUP, FOSB, etc. conformed to the SEMI standard. However, the wafer transportation container 10 is not limited to them and may be other containers capable of transporting or storing wafers in a sealing state. Incidentally, the load port apparatus 20 according to First Embodiment and a load port apparatus 120 according to Second Embodiment are explained with a similar wafer transportation container 10.

As shown in FIG. 2, the wafer transportation container 10 has a box-shaped outer shape of a substantially rectangular parallelepiped or a substantially cube. The wafer transportation container 10 includes a housing 12 where the main opening 12a (see FIG. 6) for taking in and out wafers is formed on the side of the wafer transportation container 10 and a lid 14 (see FIG. 6) detachably formed on the housing 12 and covering the main opening 12a. A groove (not illustrated) with which the bottom clamp unit of the load port apparatus 20 engages is formed on the bottom of the housing 12.

As shown in FIG. 2, the housing 12 of the wafer transportation container 10 includes a flange 13 surrounding the outer circumference of the main opening 12a. The flange 13 is disposed at the end of the housing 12 on the main opening 12a side (on the positive side in the Y-axis direction) and protrudes radially outward compared to other parts next to the center side. The flange 13 includes a flange groove 13a (engaged part) opening outward in the radial direction of the flange 13. In addition, the flange 13 includes ribs 13c circumferentially dividing the flange groove 13a and strengthening the flange 13. The radial depth of the flange groove 13a is not limited and can be, for example, about 1 mm to 25 mm. The circumferential formation intervals of the ribs 13c is not limited and can be, for example, about 15 mm to 350 mm.

When the wafer transportation container 10 is transported to a close location (dock location) close to the frame opening 24a (see FIG. 1) as shown in FIG. 2, a flange facing surface 13b (FIG. 6), which is a front surface of the flange 13 in the wafer taking direction (the positive side in the Y-axis direction), faces a periphery facing surface 25a of the frame 24 as shown in FIG. 3. As shown in FIG. 2, engagement sections 27 and 67 of the flange clamp units 26 and 66 can engage with the flange groove 13a. Incidentally, the engagement operation of the engagement sections 27 and 67 with the flange groove 13a is mentioned below using a flange clamp unit 126 of a load port apparatus according to Second Embodiment (FIG. 6 to FIG. 8) or so.

Figure 6:
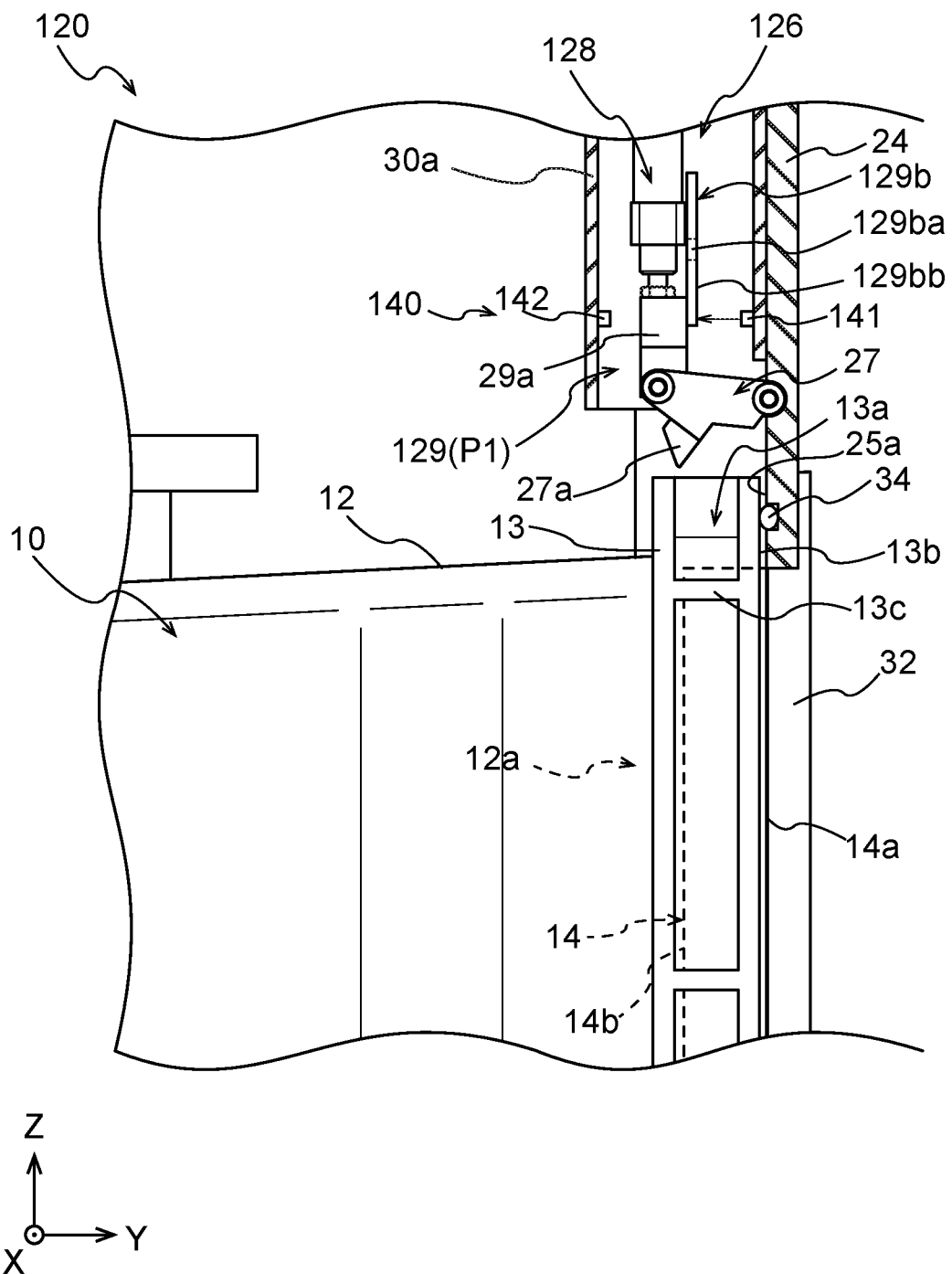
FIG. 6 is a conceptual view illustrating a state where a flange clamp unit included in a load port apparatus according to Second Embodiment is separate.
Figure 7:
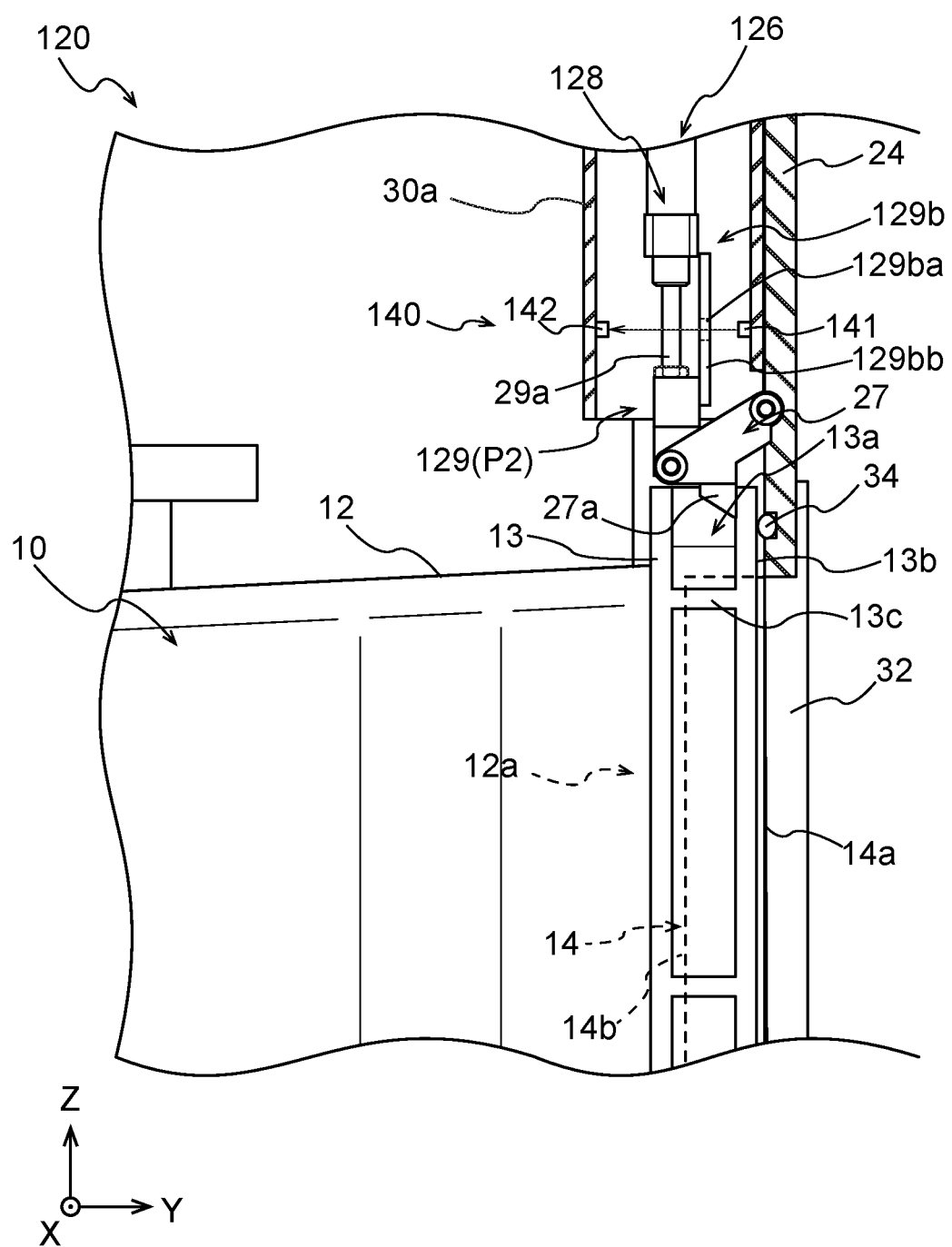
FIG. 7 is a conceptual view illustrating a state where the flange clamp unit shown in FIG. 6 is in a normal engagement operation.
Figure 8:
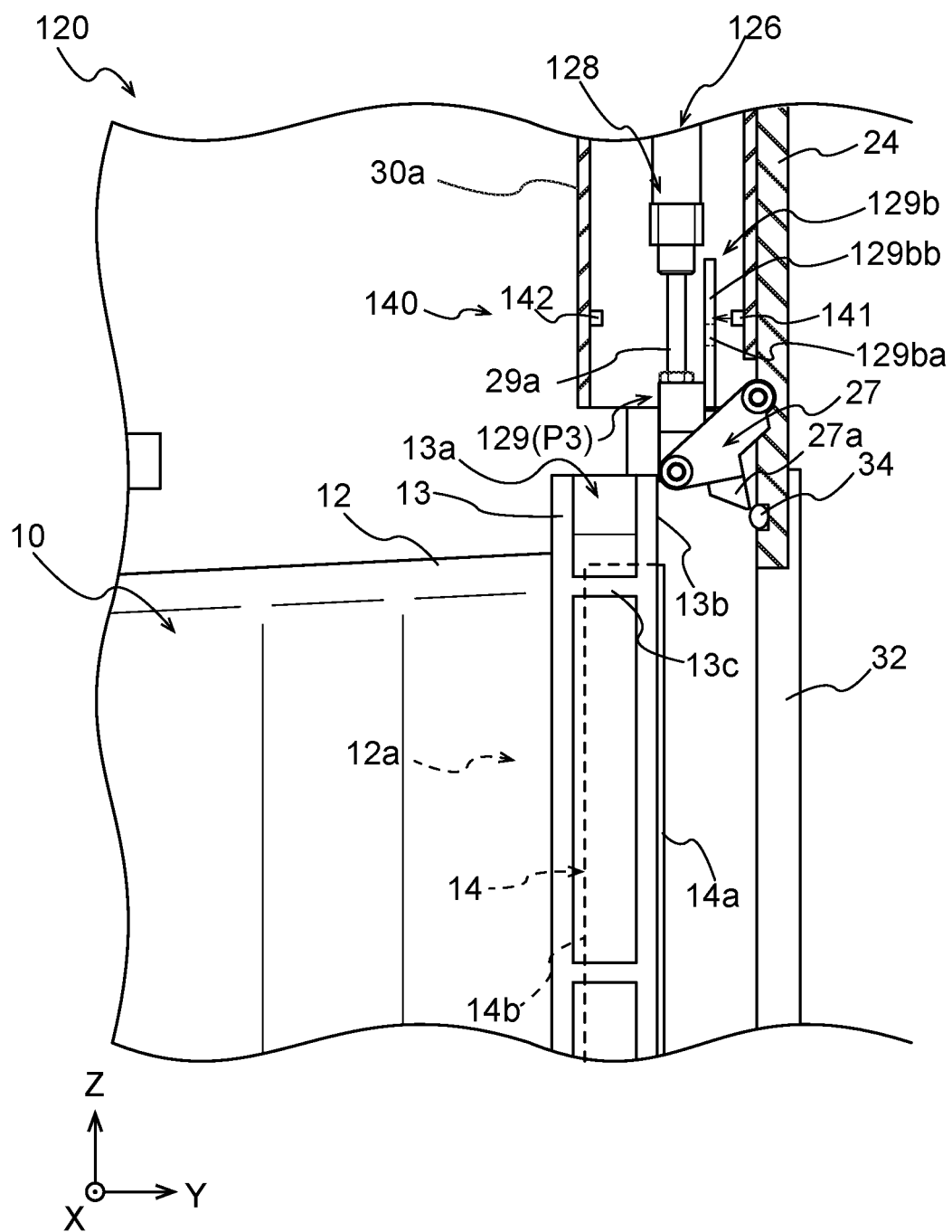
FIG. 8 is a conceptual view illustrating a state where the flange clamp unit shown in FIG. 6 is in an abnormal engagement operation.

The lid 14 of the wafer transportation container 10 (see FIG. 6 to FIG. 8) is detachably attached to the main opening 12a. As shown in FIG. 6 to FIG. 8, the lid 14 includes a lid outer surface 14a facing the door 32 of the load port apparatus 20 and a lid rear surface 14b facing wafers inside the housing 12 (an opposite surface of the lid outer surface 14a). From a point of secure engagement between the door 32 and the lid 14, it is preferred that the lid outer surface 14a slightly protrudes from the flange facing surface 13b to the wafer taking direction (the positive side in the Y-axis direction) in a state where the lid 14 closes the main opening 12a.

As shown in FIG. 1, the installation unit 22 of the load port apparatus 20 includes an installation table 23 for installing the wafer transportation container 10. As shown in FIG. 2, the installation table 23 relatively moves so that the installation table 23 and the wafer transportation container 10 placed on the installation table 23 move to or from the frame opening 24a. The installation table 23 is driven by driving means, such as air cylinders and motors (not shown), but may be driven by any drive section. The installation table 23 of the installation unit 22 may not only be horizontally movable, but may be rotationally by 180 degrees in a state where the wafer transportation container 10 is installed. This may be able to change the direction of the wafer transportation container 10. In the explanation of the load port apparatus 20, as shown in FIG. 1 and FIG. 2, the Z-axis direction is a height direction, the Y-axis direction is a direction perpendicular to the Z-axis direction and where the installation table 23 moves to or from the frame unit 24, and the X-axis direction is a direction perpendicular to the Z-axis direction and the Y-axis direction.

As shown in FIG. 2, the frame unit 24 stands upright from the installation unit 22. The frame unit 24 includes the frame opening 24a located above the installation unit 22 and has a frame shape. As shown in FIG. 2, the load port apparatus 20 includes the door 32 that opens or closes the frame opening 24a.

The door 32 is driven by the door drive section 33. In addition, the door 32 sticks to and engages with the lid outer surface 14a of the lid 14 attached to the main opening 12a of the wafer transportation container 10 and opens or closes the main opening 12a and the frame opening 24a. That is, the door 32 moves integrally with the lid 14 and thereby makes it possible to open the frame opening 24a and to open the main opening 12a by detaching the lid 14 from the main opening 12a.

The coverage unit 30 as shown in FIG. 1 and FIG. 2 is disposed in the periphery of the frame opening 24a. The coverage unit 30 is disposed at least above or sideways the frame opening 24a and partly covers the periphery of the frame opening 24a. That is, the coverage unit 30 is partly disposed on the periphery facing surface 25a facing the installation table 23 side (the negative side in the Y-axis direction) in a peripheral section 25 in the transportation direction of the wafer transportation container 10 by the installation unit 22. As understood from FIG. 3 and FIG. 4, each of which illustrates a state where the coverage unit 30 is detached from the frame unit 24, the coverage unit 30 covers at least a part of the flange clamp units 26 and 66.

However, another part of the periphery facing surface 25a next to the frame opening 24a is exposed from the coverage unit 30 as shown in FIG. 1 and faces the flange 13 of the wafer transportation container 10 (particularly, the flange facing surface 13b). The periphery facing surface 25a includes a seal unit 34 for improving the sealing performance to the flange facing surface 13b. The coverage unit 30 includes a coverage distant surface 30a being the most distant from the periphery facing surface 25a in the transportation direction of the wafer transportation container 10 (Y-axis direction) (see FIG. 6). State display lamps 31 as shown in FIG. 1 and FIG. 2 are arranged on the coverage distant surface 30a. The lighting state of the state display lamps 31 changes based on the driving state of the load port apparatus 20.

FIG. 3 is a partially enlarged view illustrating a state where the coverage unit 30 is detached from the load port apparatus 20 shown in FIG. 1. As shown in FIG. 3, the load port apparatus 20 includes two flange clamp units 26 and 66. The flange clamp units 26 and 66 are arranged above the frame opening 24a with a predetermined interval. The two flange clamp units 26 and 66 are arranged to engage with the flange 13 at symmetrical locations to the center of the main opening 12a.

The flange clamp unit 66 is disposed symmetrically to the flange clamp unit 26 with a predetermined interval and has a structure similar to that of the flange clamp unit 26. Thus, the flange clamp units 26 and 66 are mainly explained as to the flange clamp unit 26, and features of the flange clamp unit 66 being common with those of the flange clamp unit 26 are not explained.

Figure 5:
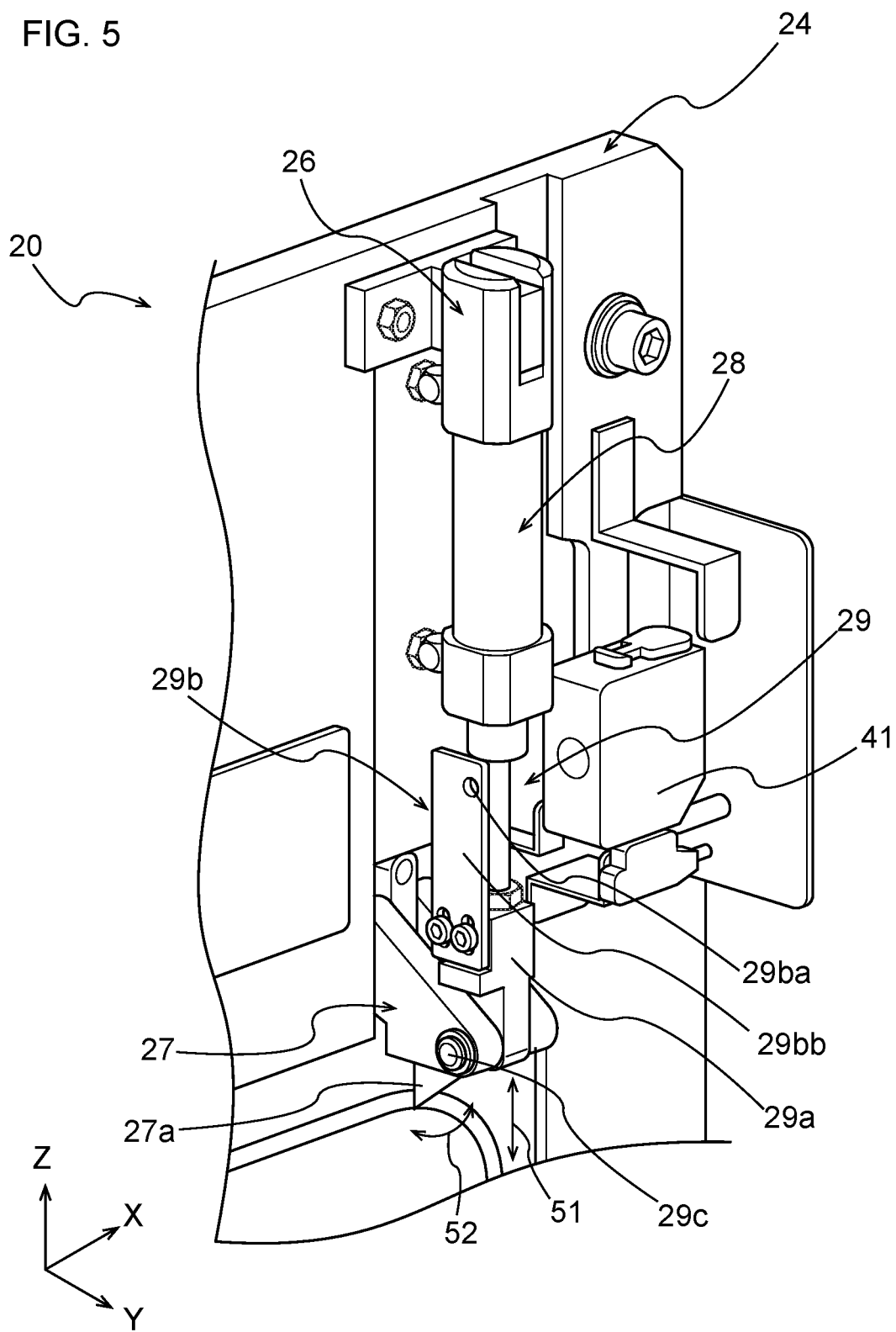
FIG. 5 is an enlarged perspective view of the flange clamp unit shown in FIG. 3.

FIG. 5 is an enlarged perspective view of the flange clamp unit 26 shown in FIG. 3. The flange clamp unit 26 includes the engagement section 27 engageable with the flange 13 of the wafer transportation container 10 and the drive section 28 for driving the engagement section 27. The drive section 28 directs the engagement section 27 to carry out an engagement operation where the engagement section 27 engages with the flange 13 (see FIG. 7 or so) and a separation operation where the engagement section 27 is separated from the flange 13 (see FIG. 6).

Figure 4:
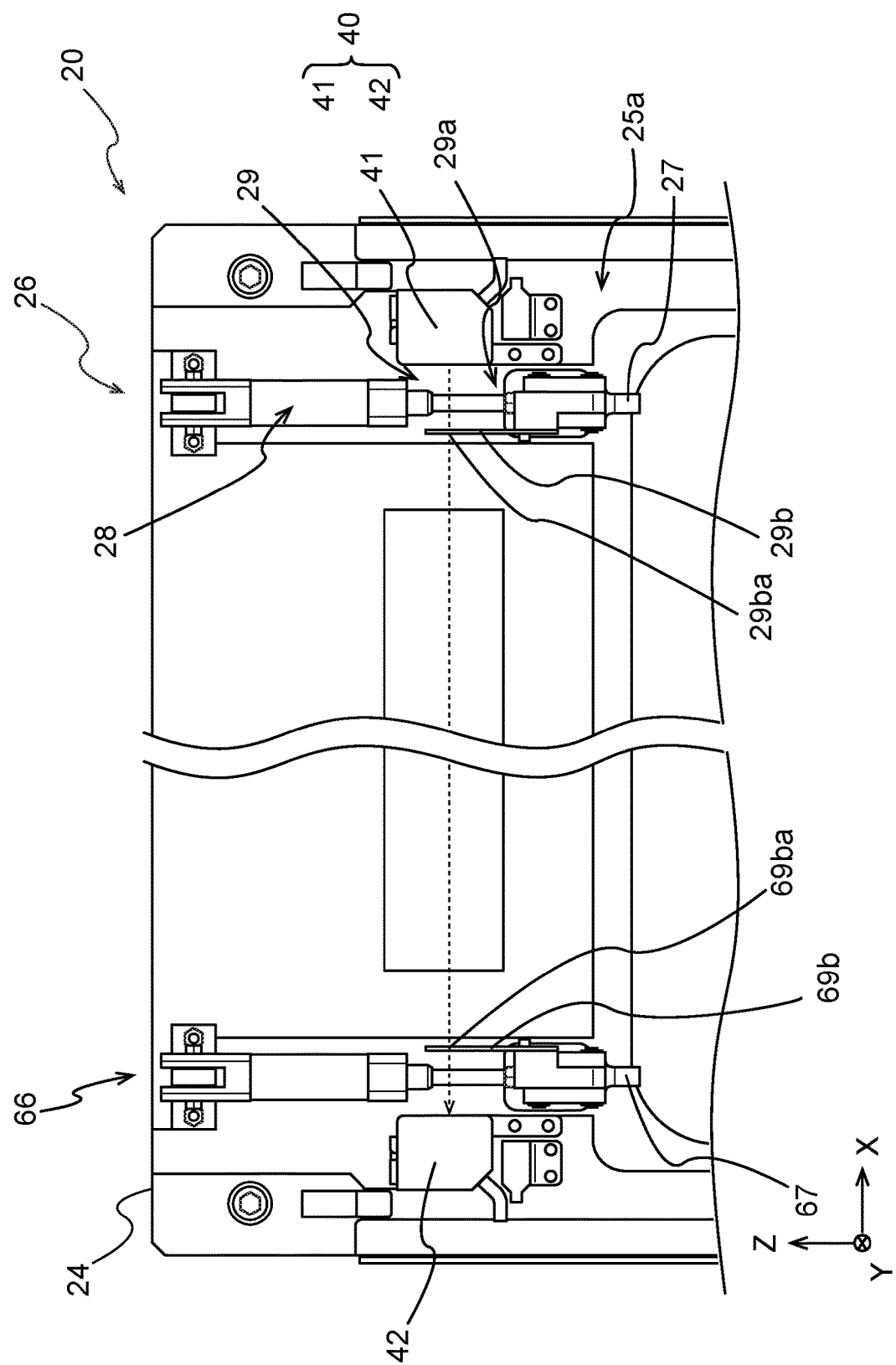
FIG. 4 is a partially enlarged view illustrating a state where an engagement section of the flange clamp unit included in the load port apparatus shown in FIG. 1 is moved from the state of FIG. 3.

As shown in FIG. 3 and FIG. 4, the engagement section 27 included in the flange clamp unit 26 and the engagement section 67 included in the flange clamp unit 66 are arranged above the frame opening 24a. As shown in FIG. 2, the engagement section 27 and the engagement section 67 can engage with the flange groove 13a formed on the flange 13 of the wafer transportation container 10 by approaching the flange groove 13a from above.

However, the locations of the engagement sections 27 and 67 included in the flange clamp units 26 and 66 are not limited to them. For example, engagement sections according to modified examples may be arranged on the lateral of the frame opening 24a. The engagement sections arranged on the lateral can engage with the flange groove 13a of the flange 13 from the lateral of the frame opening 24a. The load port apparatus 20 shown in FIG. 1 includes the two flange clamp units 26 and 66, but the number of flange clamp units 26 and 66 is not limited thereto. The load port apparatus may include one flange clamp unit or three or more flange clamp units.

The drive section 28 of the flange clamp unit 26 shown in FIG. 5 is structured by air cylinders, motors, or the like and can move the engagement section 27 via a drive shaft 29a. That is, the drive section 28 is connected to the engagement section 27 and includes a first operation portion 29 configured to reciprocate in the Z-axis direction (first direction 51). FIG. 3 illustrates a state where the first operation portion 29 of the drive section 28 is moved upward, and FIG. 4 illustrates a state where the first operation portion 29 of the drive section 28 is moved downward. As shown in FIG. 5, the first operation portion 29 includes the drive shaft 29a and a detection operation member 29b.

As shown in FIG. 5, the drive section 28 according to the preset embodiment includes an air cylinder having the drive shaft 29a configured to move vertically (Z-axis direction), and the drive shaft 29a is connected to the engagement section 27 via a rotationable connection part 29c. Incidentally, the flange clamp unit 26 may include one drive section for one engagement section 27 as shown in FIG. 3 and FIG. 4 or may include one drive section for a plurality (e.g., two) of engagement sections 27.

The engagement section 27 of the flange clamp unit 26 is connected to the drive shaft 29a via the connection part 29c and is also connected to the frame unit 24 (or the coverage unit 30) via a rotationable connection part (not illustrated). As shown in FIG. 5, the engagement section 27 includes a second operation portion 27a configured to move in a second direction 52 different from the first direction 51 based on the vertical movement (or extension and contraction) of the drive shaft 29a of the drive section 28. As mentioned below with FIG. 6 to FIG. 8, the second operation portion 27a of the engagement section 27 engages with or separates from the flange 13 of the wafer transportation container 10. Incidentally, as shown in FIG. 5, the second direction 52, which is an operation direction of the engagement section 27, is a rotation direction around the connection part 29c (central axis) between the drive shaft 29a and the engagement section 27.

As shown in FIG. 3 and FIG. 4, the load port apparatus 20 includes the detection unit 40 for detecting the operation of the flange clamp units 26 and 66. The detection unit 40 shown in FIG. 3 and FIG. 4 is a beam sensor and includes a light emitter 41 and a light receiver 42 capable of receiving the light of the light emitter 41. The light emitter 41 and the light receiver 42 are arranged to sandwich the two flange clamp units 26 and 66 from both sides in the X-axis direction. That is, the light emitter 41 is disposed in the surroundings of the end of the periphery facing surface 25a of the frame unit 24 on the positive side in the X-axis direction, and the light receiver 42 is disposed in the surroundings of the end of the periphery facing surface 25a of the frame unit 24 on the negative side in the X-axis direction.

As shown in FIG. 5, the detection operation member 29b of the first operation portion 29 of the flange clamp unit 26 passes or blocks the light of the light emitter 41 based on the location of the first operation portion 29. That is, the part of the detection operation member 29b (a plate member with the through hole 29ba as a first part for directing the light of the light emitter 41 toward the light receiver 42) other than a through hole (or a slit) 29ba is a second part 29bb configured to block, adsorb, or direct the light of the light emitter 41 toward a direction different from the light receiver 42.

The detection unit 40 shown in FIG. 3 to FIG. 5 is combined with the flange clamp unit 26 and can thereby detect an engagement operation of the wafer transportation container 10 by the flange clamp unit 26 with classification into a normal engagement operation (see FIG. 7) and an abnormal engagement operation. The detection of the engagement operation by the detection unit 40 is mentioned below with FIG. 6 to FIG. 8.

As shown in FIG. 4, the two flange clamp units 26 and 66 are arranged at the same height (position in the Z-axis direction). The light of the light emitter 41 of the detection unit 40 can enter the light receiver 42 via the through holes 29ba and 69ba, which are at least two first parts included in the detection operation members 29b and 69b of the flange clamp units 26 and 66. Since the detection unit 40 and the flange clamp units 26 and 66 are arranged in such a manner, one detection unit 40 can detect an engagement operation of the two flange clamp units 26 and 66 and can enter the light of the light emitter 41 into the light receiver 42 at the time of normal engagement operation of the two flange clamp units 26 and 66.

As shown in FIG. 1, the load port apparatus 20 includes the interlock system 37 configured to allow the door drive section 33 to open the door 32 only when the detection unit 40 detects a normal engagement operation. A detection signal from the detection unit 40 is inputted to the interlock system 37. For example, the interlock system 37 may be one achieved by hardware, such as a circuit where electric power for opening the door 32 is supplied to the door drive section 33 only when the detection unit 40 detects a normal engagement operation, or may be one achieved by controlling hardware by arithmetic processing using software.

Hereinafter, the operations of a detection unit 140 and a flange clamp unit 126 are explained with the load port apparatus 120 according to Second Embodiment shown in FIG. 6 to FIG. 8. The load port apparatus 120 according to Second Embodiment is different from the load port apparatus according to First Embodiment in that a light emitter 141 and a light receiver 142 included in a detection unit 140 are arranged to sandwich one flange clamp unit 126 in the Y-axis direction, and that a through hole 129ba as a first part of a detection operation member 129b of the flange clamp unit 126 can pass the light of the light emitter 141 in the Y-axis direction.

However, the detection unit 140 shown in FIG. 6 to FIG. 8 is similar to the detection unit 40 according to First Embodiment, except that the light emitter 141 and the light receiver 142 are attached on inner surfaces of the coverage unit 30 facing each other in the Y-axis direction. In addition, the flange clamp unit 126 is similar to the flange clamp unit 26 shown in FIG. 1, except that the attachment direction of the detection operation member 129b is rotated by 90 degrees. In addition, the load port apparatus 120 according to Second Embodiment is similar to the load port apparatus 20 except for the detection unit 140 and the flange clamp unit 126. Thus, common matters between the load port apparatus 20 according to First Embodiment and the load port apparatus 120 according to Second Embodiment are not explained. In addition, the operations of the flange clamp units 26 and 66, the detection unit 40, and the like according to First Embodiment are similar to those of the flange clamp unit 126, the detection unit 140, and the like of the load port apparatus 120 explained below.

Figure 9:
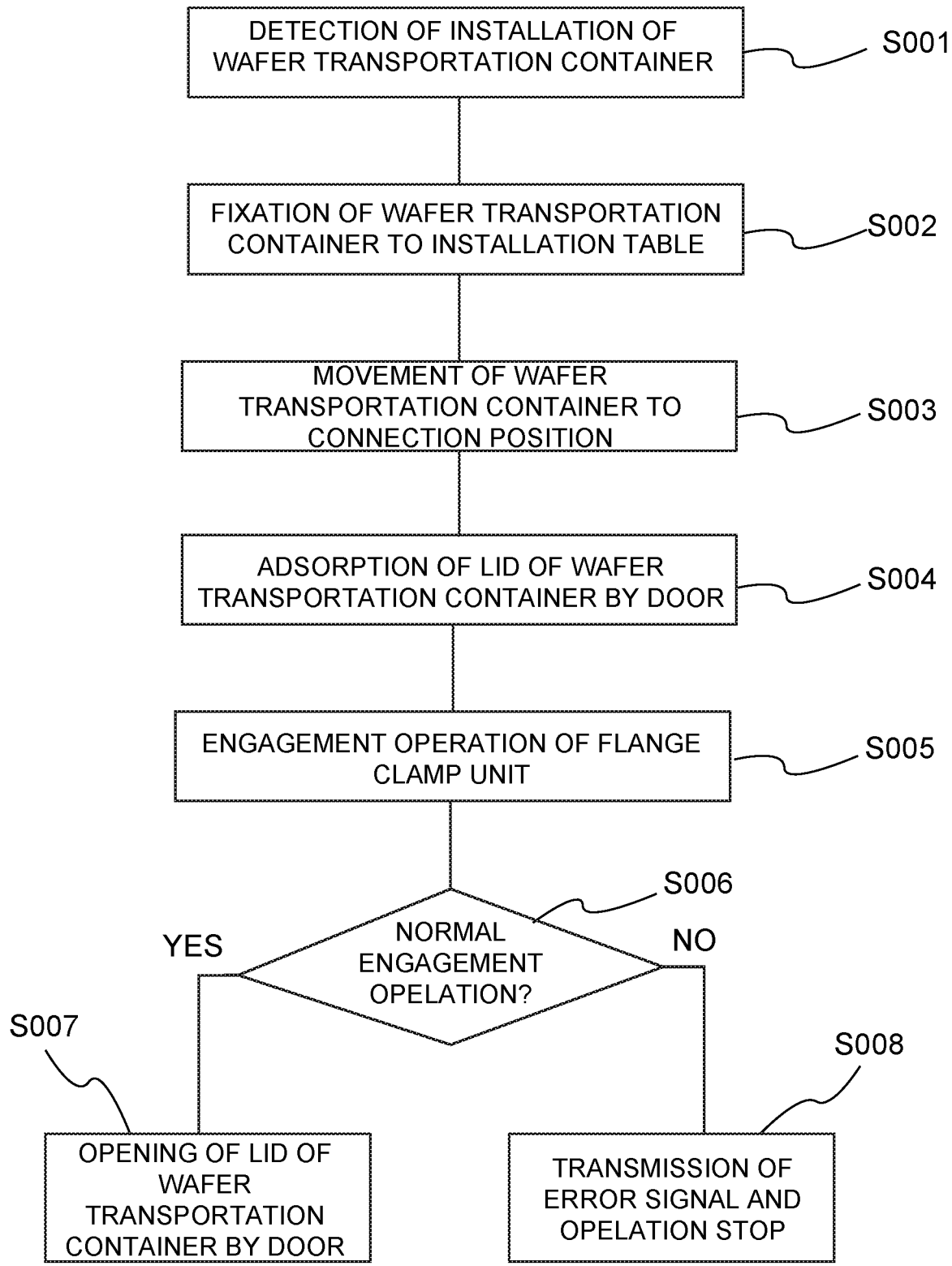
FIG. 9 is a flowchart illustrating a method of driving the load port apparatus shown in FIG. 6.

FIG. 9 is a flowchart illustrating a method of driving the load port apparatus 120 shown in FIG. 6 to FIG. 8. In Step S001 of FIG. 9, the installation of the wafer transportation container 10 to the installation table 23 (see FIG. 1) is detected by an installation sensor (not illustrated). The wafer transportation container 10 is transported to the installation table 23 of the load port apparatus 120 by, for example, OHT in semiconductor factories.

In Step S002 of FIG. 9, the wafer transportation container 10 is fixed to the installation table 23. Although not illustrated in FIG. 1, the installation table 23 is provided with a bottom clamp unit engageable with the bottom of the wafer transportation container 10, and the load port apparatus 120 can fix the wafer transportation container 10 to the installation table 23.

In Step S003 of FIG. 9, the wafer transportation container 10 installed on the installation table 23 is transported to a connection position where the wafer transportation container 10 is close to the frame opening 24a. At the connection position, the lid 14 of the wafer transportation container 10 contacts with the door 32 (see FIG. 1). In Step S004 of FIG. 9, the door 32 adsorbs the lid 14 of the wafer transportation container 10. FIG. 6 is a conceptual view illustrating a state where the flange clamp unit 126 included in the load port apparatus 120 is in a separation operation and indicates a state immediately before the start of Step S005.

As shown in FIG. 6, the engagement section 27 of the flange clamp unit 126 is at an evacuation position obtained by the separation operation of the flange clamp unit 126 while the installation table 23 on which the wafer transportation container 10 is installed is at an undock position away from the frame opening 24a, the wafer transportation container 10 is being transported by the installation table 23, and the like during Step S001 to Step S004 shown in FIG. 9. The engagement section 27 at the evacuation position is separated from the flange 13 of the wafer transportation container 10. In addition, the engagement section 27 at the evacuation position does not interfere with a traffic line of the wafer transportation container 10 (i.e., a movement path of the wafer transportation container 10). Incidentally, the engagement section 27 is also located at the same evacuation position as the state of the separation operation of the flange clamp unit 126 by initial operations, such as immediately after power on or reset.

In the state of FIG. 6, a first operation portion 129 of a drive section 128 of the flange clamp unit 126 is disposed uppermost in the states of FIG. 6 to FIG. 8 and is at a first position P1. When the first operation portion 129 is at the first position P1, a second part 129bb of the detection operation member 129b of the first operation portion 129 blocks the light of the light emitter 141, and the light of the light emitter 141 does not thereby enter the light receiver 142. Thus, the detection unit 140 can determine that the flange clamp unit 126 is not in a normal engagement operation for the flange 13.

In Step S005 of FIG. 9, the drive section 128 of the flange clamp unit 126 is driven so that the engagement section 27 of the flange clamp unit 126 engages with the flange 13 of the wafer transportation container 10. FIG. 7 is a conceptual view illustrating a state where the flange clamp unit 126 included in the load port apparatus 126 is in a normal engagement operation and illustrates a state immediately after Step S005 is finished.

As shown in FIG. 7, the engagement section 27 of the flange clamp unit 126 moves to an engagement position obtained by a normal engagement operation of the flange clamp unit 126 by driving of the drive section 128. The engagement section 27 at the engagement position interferes with the movement path of the wafer transportation container 10 and engages with the flange 13. As understood from the comparison between FIG. 6 and FIG. 7, the engagement section 27 moves from the evacuation position shown in FIG. 6 to the engagement position shown in FIG. 7 (normal engagement position) by rotation with the descent of the drive shaft 29a and engages with the flange groove 13a of the flange 13 of the wafer transportation container 10 at the dock position from above (specifically, from diagonally above and behind).

As shown in FIG. 7, the engagement section 27 at the engagement position engages with the flange 13 so as to push the flange facing surface 13b of the wafer transportation container 10 against the periphery facing surface 25a of the frame 24. That is, the first direction (Z-axis direction), where the first operation portion 129 of the drive section 128 reciprocates, is substantially perpendicular to a third direction (Y-axis direction), where the engagement section 27 pushes the flange 13 against the frame unit 24. This makes it possible to improve the sealing performance between the flange facing surface 13b and the periphery facing surface 25a and also makes it possible to prevent a problem of deviation of the wafer transportation container 10 from a normal position due to, for example, vibrations of opening operation of the lid 14 by the door 32. In particular, it is preferred that the engagement of the engagement section 27 with the flange 13 allows the flange facing surface 13b to stand upright as shown in FIG. 7 and be positioned between the lid outer surface 14a and the lid rear surface 14b in the transportation direction of the wafer transportation container 10 by the installation unit 22. When the engagement section 27 maintains the posture of the wafer transportation container 10 in such a manner, the door 32 can allow the lid 14 to smoothly open, and the sealing performance between the flange facing surface 13b and the periphery facing surface 25a can be enhanced during, for example, the opening operation of the lid 14.

As shown in FIG. 7, at least when the flange 13 is normally engaged by the engagement section 27, the flange clamp unit 126 is disposed between the frame unit 24 and the coverage distant surface 30a of the coverage unit 30, which is the most distant from the periphery facing surface 25a, in the transportation direction of the wafer transportation container 10 by the installation unit 22. Preferably, the flange clamp unit 126 is disposed within a region of 75 mm from the frame unit 24 in the transportation direction of the wafer transportation container 10 by the installation unit 22 (Y-axis direction). Such a flange clamp unit 126 is small, and it is possible to reduce a movement distance for engagement of the engagement section 27 with the flange 13.

The coverage unit 30 may be thicker than the flange clamp unit 126 in the transportation direction of the wafer transportation container 10 by the installation unit 22. When the flange clamp unit 126 is thinned so as not to protrude from the coverage distant surface 30a toward the installation table 23 side, the flange clamp unit 126 does not contact with the wafer transportation container 10 during the transportation of the wafer transportation container 10 toward the above by OHT or so.

In the state of FIG. 7, the first operation portion 129 of the drive section 128 of the flange clamp unit 126 is disposed lower compared to the state of FIG. 6 and is at a second position P2. When the first operation portion 129 is at the second position P2, the through hole 129ba as the first part of the detection operation member 129b of the first operation portion 129 passes the light of the light emitter 141. This allows the light of the light emitter 141 to enter the light receiver 142. Thus, the detection unit 140 can determine that the flange clamp unit 126 is in a normal engagement operation for the flange 13.

In Step S006 of FIG. 9, the load port apparatus 120 detects whether or not the engagement operation in Step S005 is a normal engagement operation based on the signal of the detection unit 140. As shown in FIG. 7, the light receiver 142 of the detection unit 140 receives the light from the light emitter 141, and a normal engagement operation of the flange clamp unit 126 is thereby detected. In this case, the load port apparatus 120 proceeds to Step S007. In Step S007, the door drive section 33 (see FIG. 1) of the load port apparatus 120 drives the door 32 to open the lid 14 and the frame opening 24a.

As a result of the engagement operation in Step S005 of FIG. 9, the flange clamp unit 126 may carry out an abnormal engagement operation. FIG. 8 is a conceptual view illustrating a state where the flange clamp unit 126 included in the load port apparatus 120 is in an abnormal engagement operation and illustrates another state immediately after Step S005 is finished.

When the wafer transportation container 10 is fixed to the installation table 23 while being inclined as shown in FIG. 8, when the wafer transportation container 10 is deformed, or the like, a space may be formed between the flange 13 and the frame unit 24. In such a state, the flange 13 is not disposed on the passage of the second operation portion 27a of the engagement section 27 of the flange clamp unit 126, and the engagement section 27 cannot engage with the flange 13. Thus, the engagement section 27 of the flange clamp unit 126 carries out an abnormal engagement operation where the engagement section 27 of the flange clamp unit 126 is more largely rotated compared to a normal engagement operation by the driving of the drive section 128, and the engagement section 27 of the flange clamp unit 126 is located at an abnormal position shown in FIG. 8.

In the state of FIG. 8, the first operation portion 129 of the drive section 128 of the flange clamp unit 126 is disposed further lower compared to the state of FIG. 7 and is located at a third position P3. When the first operation portion 129 is at the third position P3, the second part 129bb of the detection operation member 129b of the first operation portion 129 blocks the light of the light emitter 141, and the light of the light emitter 141 does not thereby enter the light receiver 142. Thus, the detection unit 140 can determine that the flange clamp unit 126 is not in a normal engagement operation for the flange 13.

As mentioned above, when the flange clamp unit 126 carries out an abnormal engagement operation, the light receiver 142 of the detection unit 140 cannot receive the light from the light emitter 141, and a normal engagement operation of the flange clamp unit 126 is not detected in Step S006. In this case, the load port apparatus 120 proceeds to Step S008. In Step S008, the load port apparatus 120 transmits an error signal and stops its operation.

As shown in FIG. 6 to FIG. 8, the first operation portion 129 of the drive section 128 is movable among the first position P1 (FIG. 6), the second position P2 (FIG. 7), and the third position P3 (FIG. 8) in the Z-axis direction (first direction). As shown in FIG. 6, when the first operation portion 129 is at the first position P1, the engagement section 27 is separate from the flange 13. As shown in FIG. 7, when the first operation portion 129 is at the second position P2, the engagement section 27 is in a normal engagement operation for the flange 13. As shown in FIG. 8, when the first operation portion 129 is at the third position P3, the engagement section 27 is in an abnormal engagement operation for the flange 13.

As shown in FIG. 6 and FIG. 8, when the first operation portion 129 of the drive section 128 is at the first position P1 (FIG. 6) and the third position P3 (FIG. 8), the light from the light emitter 141 of the detection unit 140 is blocked by the second part 129bb of the detection operation member 129b of the first operation portion 129 and does not enter the light receiver 142. On the other hand, as shown in FIG. 7, when the first operation portion 129 of the drive section 128 is at the second position P2 (FIG. 8), the light from the light emitter 141 of the detection unit 140 passes through the through hole 129ba of the detection operation member 129b of the first operation portion 129 and enters the light receiver 142. Accordingly, the detection unit 140 detects that the first operation portion 129 is at the second position P2 while distinguishing a case where the first operation portion 129 is at the first position P1 or the third position P3.

As shown in FIG. 9, the load port apparatus 120 can carry out a step of opening the lid 14 and the frame opening 24a (Step S007) only when the detection unit 140 detects a normal engagement operation. Thus, the load port apparatus 120 prevents the lid 14 of the wafer transportation container 10 from opening even if the flange clamp unit 126 carries out an abnormal engagement operation and can securely prevent a leakage problem of inner gas to the outside.

Incidentally, the abnormal engagement operation, which the detection unit 140 distinguishes from the normal engagement operation, is not limited to only the case where the first operation portion 129 is below the second position P2, where the first operation portion 129 is at the normal engagement operation, as shown in FIG. 8. For example, when the wafer transportation container 10 is fixed with inclination, the engagement section 27, which rotates in the second direction 52 (see FIG. 5) by the engagement operation, may bump into the end of the flange 13 in its outer radial direction and not be able to enter the flange groove 13a.

In such a case, as shown in FIG. 7, the first operation portion 129 of the drive section 128 is between the first position P1 (FIG. 6) and the second position P2 (FIG. 7).

When the detection operation member 129b of the first operation portion 129 has an appropriate shape, and the first operation portion 129 blocks the light of the light emitter 141 while being stopped at such a position, the detection unit 140 can determine such an engagement operation as an abnormal engagement operation.

As shown in FIG. 7, since the load port apparatus 120 includes the engagement section 27 engageable with the flange groove 13a of the wafer transportation container 10, the connection state between the main opening 12a of the wafer transportation container 10 and the frame opening 24a can favorably be supported by the small engagement section 27. In the state of the dock position, the flange 13 is disposed near the frame peripheral section 25, and it is thereby possible to reduce the movement distance of the engagement section 27 and shorten the time for operation of the flange clamp unit 126. In addition, the engagement section 27 can support the connection state between the main opening 12a of the wafer transportation container 10 and the frame opening 24a together with the bottom clamp unit engageable with the bottom of the wafer transportation container 10. In particular, when the engagement section 27 is engaged with the flange 13 at a position above the center of the wafer transportation container 10, such a load port apparatus 20 can also appropriately hold the upper part of the wafer transportation container 10, where a positional shifting is easily generated if only the bottom clamp unit is used.

Hereinabove, the present invention is explained with embodiments, but is not limited to only the above-mentioned embodiments and, needless to say, includes multiple other embodiments, modified examples, and the like. For example, the shape and structure of the flange clamp unit 26 are not limited to those exemplified in FIG. 1 to FIG. 8. As shown in FIG. 4 and FIG. 6 to FIG. 8, the detection unit 140 included in the load port apparatus 20 (120) is not limited to only beam sensors and may be a sensor other than optical sensors, such as magnet sensors and contact sensors.

In the example of FIG. 6 to FIG. 8, the light receiver 142 of the detection unit 140 can receive the light of the light emitter 141 in the normal engagement operation, but on the other hand, the detection unit 140 may be configured so that the light receiver 142 can receive the light of the light emitter 141 in the abnormal engagement operation. Incidentally, the detection unit 140 in which the light receiver 142 can receive the light in the normal engagement operation is preferable because it is possible to prevent a problem of misdetection of the normal engagement operation when the light is not received due to, for example, breakage of the light emitter 141.

DESCRIPTION OF THE REFERENCE NUMERICAL

10 . . . wafer transportation container
12 . . . housing
12a . . . main opening
13 . . . flange
13a . . . flange groove
13b . . . flange facing surface
13c . . . rib
14 . . . lid
14a . . . lid outer surface
14b . . . lid rear surface
20 . . . load port apparatus
22 . . . installation unit
23 . . . installation table
24 . . . frame
24a . . . frame opening
25a . . . periphery opposing surface
26, 66, 126 . . . flange clamp unit
27, 67 . . . engagement section
27a . . . second operation portion
28, 128 . . . drive section
29, 129 . . . first operation portion
29a . . . drive shaft
29b, 129b . . . detection operation member
29ba, 129ba . . . through hole
29bb, 129bb . . . second part
30 . . . coverage unit
30a . . . coverage distant surface
31 . . . state display lamp
32 . . . door
33 . . . door drive section
34 . . . seal unit
37 . . . interlock system
38 . . . bottom purge unit
40, 140 . . . detection unit
41, 141 . . . light emitter
42, 142 . . . light receiver
51 . . . first direction
52 . . . second direction

What is claimed is:

1. A load port apparatus for connecting a main opening of a wafer transportation container to a frame opening, the apparatus comprising:
an installation unit including an installation table configured to install the wafer transportation container and relatively move to the frame opening;
a frame unit being upright upward from the installation unit and including the frame opening;
a flange clamp unit including:
an engagement section engageable with a flange surrounding an outer circumference of the main opening; and
a drive section for driving the engagement section to carry out an engagement operation for engaging the engagement section with the flange and a separation operation for separating the engagement section from the flange; and
a detection unit configured to detect the engagement operation by the flange clamp unit with classification into a normal engagement operation and an abnormal engagement operation, wherein:
the drive section includes a first operation portion that is movable among a first position, a second position, and a third position in a first direction;
the engagement section is separate from the flange when the first operation portion is at the first position;
the engagement section is in the normal engagement operation for the flange when the first operation portion is at the second position;
the engagement section is in the abnormal engagement operation for the flange when the first operation portion is at the third position; and
the detection unit detects that the first operation portion is at the second position while distinguishing from a case where the first operation portion is at the first position or the third position.

2. The load port apparatus according to claim 1, wherein the engagement section engages from above or side with an engaged part formed on the flange and opening in an outer radial direction of the flange.

3. The load port apparatus according to claim 1, wherein
the first operation portion of the drive section is connected to the engagement section and configured to reciprocate in the first direction, and
the engagement section includes a second operation portion configured to operate in a second direction different from the first direction and to engage with or separate from the flange.

4. The load port apparatus according to claim 3, wherein the first direction, in which the first operation portion reciprocates, is substantially perpendicular to a third direction, in which the engagement section pushes the flange against the frame unit.

5. The load port apparatus according to claim 3, wherein
the detection unit includes a light emitter and a light receiver capable of receiving a light of the light emitter, and
the first operation portion includes a detection operation member including:
a first part configured to direct the light of the light emitter toward the light receiver; and
a second part configured to block, adsorb, or direct the light of the light emitter toward a direction different from the light receiver.

6. The load port apparatus according to claim 1, further comprising a coverage unit attached to the frame unit on a side of the installation unit and at least partly covering the flange clamp unit, the coverage unit including a coverage distant surface that is a most distant surface of the coverage unit from a periphery facing surface of the frame unit.

7. A method of driving the load port apparatus according to claim 1, comprising the steps of:
transporting a wafer transportation container installed on the installation table to a connection position, at which the wafer transportation container is close to the frame opening of the frame unit;
driving the drive section of the flange clamp unit so as to carry out the engagement operation, during which the engagement section of the flange clamp unit engages with a flange of the wafer transportation container;
detecting whether or not the engagement operation of the engagement section is a normal engagement operation;
opening a lid attached to a main opening of the wafer transportation container and the frame opening;
detecting, by the detection unit, (i) that the engagement section is separate from the flange when the first operation portion of the drive section is at the first position and (ii) that the engagement section is in the normal engagement operation for the flange when the first operation portion is at the second position; and
detecting, by the detection unit, that the engagement section is in the abnormal engagement operation for the flange when the first operation portion is at the third position,
wherein the step of opening the lid and the frame opening can be carried out only when the normal engagement operation is detected.

8. A load port apparatus for connecting a main opening of a wafer transportation container to a frame opening, the apparatus comprising:
an installation unit including an installation table configured to install the wafer transportation container and relatively move to the frame opening;
a frame unit being upright upward from the installation unit and including the frame opening;
at least two flange clamp units arranged with a predetermined interval, each of the flange clamp units including:
an engagement section engageable with a flange surrounding an outer circumference of the main opening; and
a drive section for driving the engagement section to carry out an engagement operation for engaging the engagement section with the flange and a separation operation for separating the engagement section from the flange; and
a detection unit configured to detect the engagement operation by each flange clamp unit with classification into a normal engagement operation and an abnormal engagement operation; wherein:
the drive section of each flange clamp unit includes a first operation portion connected to the corresponding engagement section and configured to reciprocate in a first direction;
the detection unit includes a light emitter and a light receiver capable of receiving a light of the light emitter;
the first operation portion of each flange clamp unit includes a detection operation member including:
a first part configured to direct the light of the light emitter toward the light receiver; and
a second part configured to block, adsorb, or direct the light of the light emitter toward a direction different from the light receiver; and
the light of the light emitter of the detection unit can enter the light receiver via at least two first parts included in the detection operation members of the flange clamp units.

9. A method of driving the load port apparatus according to claim 8, comprising the steps of:
transporting a wafer transportation container installed on the installation table to a connection position, at which the wafer transportation container is close to the frame opening of the frame unit;
driving the drive sections of the flange clamp units so as to carry out the engagement operation, during which the engagement section of each flange clamp unit engages with a flange of the wafer transportation container;
detecting, with the detection unit, whether or not the engagement operation of the engagement sections is a normal engagement operation; and
opening a lid attached to a main opening of the wafer transportation container and the frame opening,
wherein the step of opening the lid and the frame opening can be carried out only when the normal engagement operation is detected.

10. The method of driving the load port apparatus according to claim 9, wherein the engagement section of each flange clamp unit includes a second operation portion configured to operate in a second direction different from the first direction and to engage with or separate from the flange.

11. The load port apparatus according to claim 8, wherein the engagement section of each flange clamp unit includes a second operation portion configured to operate in a second direction different from the first direction and to engage with or separate from the flange.

* * * * *